United States Patent
Mazzochette et al.

(10) Patent No.: US 7,252,408 B2
(45) Date of Patent: Aug. 7, 2007

(54) LED ARRAY PACKAGE WITH INTERNAL FEEDBACK AND CONTROL

(75) Inventors: Joseph Mazzochette, Cherry Hill, NJ (US); Greg E. Blonder, Summit, NJ (US)

(73) Assignee: Lamina Ceramics, Inc., Westampton, NJ (US)

( * ) Notice: Subject to any disclaimer, the term of this patent is extended or adjusted under 35 U.S.C. 154(b) by 56 days.

(21) Appl. No.: 10/894,185

(22) Filed: Jul. 19, 2004

(65) Prior Publication Data
US 2006/0012986 A1    Jan. 19, 2006

(51) Int. Cl.
*H01L 29/22* (2006.01)
(52) U.S. Cl. ................... 362/294; 257/99; 257/88
(58) Field of Classification Search ........... 362/294, 362/227; 257/99, 88, 712, 713, 717; 250/559.11, 250/559.15
See application file for complete search history.

(56) References Cited

U.S. PATENT DOCUMENTS

| | | | |
|---|---|---|---|
| 3,711,789 A | 1/1973 | Dierschke | |
| 4,886,709 A | 12/1989 | Sasame et al. | 428/552 |
| 4,935,655 A | 6/1990 | Ebner | |
| 5,117,281 A | 5/1992 | Katsuraoka | 357/81 |
| 5,122,781 A | 6/1992 | Saubolle | 340/473 |
| 5,140,220 A | 8/1992 | Hasegawa | 313/512 |
| 5,482,898 A | 1/1996 | Marrs | 437/216 |
| 5,485,037 A | 1/1996 | Marrs | 257/712 |
| 5,581,876 A | 12/1996 | Prabhu et al. | 29/851 |
| 5,660,461 A | 8/1997 | Ignatius et al. | |
| 5,725,808 A | 3/1998 | Tormey et al. | 252/514 |
| 5,745,624 A | 4/1998 | Chan et al. | 385/91 |
| 5,841,244 A * | 11/1998 | Hamilton et al. | 315/248 |
| 5,847,935 A * | 12/1998 | Thaler et al. | 361/761 |
| 5,857,767 A | 1/1999 | Hochstein | 362/294 |
| 5,953,203 A | 9/1999 | Tormey et al. | 361/313 |
| 5,977,567 A | 11/1999 | Verdiell | 257/99 |
| 6,016,038 A * | 1/2000 | Mueller et al. | 315/291 |
| 6,045,240 A | 4/2000 | Hochstein | 362/294 |
| 6,220,722 B1 | 4/2001 | Begemann | 362/231 |
| 6,259,846 B1 * | 7/2001 | Roach et al. | 385/123 |
| 6,318,886 B1 | 11/2001 | Stopa et al. | |
| 6,325,524 B1 | 12/2001 | Weber et al. | 362/245 |
| 6,376,268 B1 | 4/2002 | Verdiell | 438/26 |

(Continued)

FOREIGN PATENT DOCUMENTS

JP    2000-294701    10/2000    ........ 257/712

*Primary Examiner*—Renee Luebke
*Assistant Examiner*—Evan Dzierzynski
(74) *Attorney, Agent, or Firm*—Darby & Darby

(57) ABSTRACT

A packaged LED array for high temperature operation comprises a metal base, the metal base including an underlying thermal connection pad. One or more layers of ceramic overly the metal base. The array includes a plurality of LED dice, each LED die having electrodes. And, the LED thermally coupled to the metal base. A driver circuit is electrically connected to the LED die electrodes and controls the LED array current. An LED driver is mounted within the LED array package, and thermally coupled to the metal base. In a second embodiment, one or more of the LED dice can be switched from the driver to a measurement circuit and used as a photodetector to measure the light output of the LED array. The measured photodetector signal can further be used as a feedback signal to control the LED array light output.

9 Claims, 7 Drawing Sheets

U.S. PATENT DOCUMENTS

| | | |
|---|---|---|
| 6,428,189 B1 | 8/2002 | Hochstein .................. 362/373 |
| 6,455,930 B1 | 9/2002 | Palanisamy et al. ........ 257/706 |
| 6,480,389 B1 | 11/2002 | Shie et al. .................. 361/707 |
| 6,483,623 B1 | 11/2002 | Maruyama ................. 359/180 |
| 6,518,502 B2 | 2/2003 | Hammond et al. ........ 174/52.4 |
| 6,634,750 B2 | 10/2003 | Neal et al. .................. 351/211 |
| 6,634,770 B2 | 10/2003 | Cao .......................... 362/294 |
| 6,670,751 B2 | 12/2003 | Song et al. |
| 6,692,252 B2 | 2/2004 | Scott ........................... 433/29 |
| 6,793,374 B2 | 9/2004 | Begemann |
| 2001/0032985 A1* | 10/2001 | Bhat et al. ..................... 257/88 |
| 2002/0004251 A1 | 1/2002 | Roberts et al. ............... 438/26 |
| 2002/0034834 A1 | 3/2002 | Verdiell ....................... 438/22 |
| 2002/0163006 A1* | 11/2002 | Yoganandan et al. ......... 257/81 |
| 2002/0175621 A1 | 11/2002 | Song et al. .................. 313/515 |
| 2002/0176250 A1 | 11/2002 | Bohler et al. ................ 362/236 |
| 2003/0010933 A1* | 1/2003 | Okino ..................... 250/491.1 |
| 2003/0025465 A1* | 2/2003 | Swanson et al. ............ 315/291 |
| 2003/0057421 A1 | 3/2003 | Chen ........................... 257/79 |
| 2004/0026706 A1 | 2/2004 | Bogner et al. ................ 257/99 |
| 2004/0150995 A1 | 8/2004 | Coushaine et al. |
| 2004/0222433 A1 | 11/2004 | Mazzochette et al. ........ 257/99 |
| 2004/0233672 A1 | 11/2004 | Dubuc |
| 2005/0029535 A1 | 2/2005 | Mazzochette et al. |
| 2005/0189557 A1 | 9/2005 | Mazzochette et al. |
| 2005/0225222 A1 | 10/2005 | Mazzochette et al. |
| 2006/0214888 A1* | 9/2006 | Schneider et al. ............ 345/76 |

* cited by examiner

LED ARRAY PACKAGE WITH INTERNAL FEEDBACK AND CONTROL

FIELD OF THE INVENTION

This invention relates to an apparatus for co-packaging light emitting diode (LED) arrays with electronic driver and feedback circuitry wherein the electronic driver and control circuitry are incorporated within the LED array package. The invention also relates to, a method and apparatus for monitoring and controlling the LED array light output using one or more dice of the LED array as a photodetector.

BACKGROUND OF THE INVENTION

Light emitting diodes (LEDs) are useful in a wide variety of applications. An LED array is an array of LED die mounted on a common substrate. LED arrays are used as light sources in an increasing variety of applications including communications and instrumentation; commercial and household room lighting; and automotive and visual displays. LED Arrays are devices comprising a plurality of LEDs on the same substrate. LED arrays can be made by a variety of techniques.

One problem with LED arrays is the significant heat generated by dense concentrations of LEDs. Solutions to the thermal problems associated with LED arrays are the subject of a related application entitled "Light Emitting Diodes Packaged For High Temperature Operation", U.S. patent application Ser. No. 10/638,579, filed Aug. 11, 2003. Another problem associated with LED array performance, illumination efficiency, is the subject of a related application entitled "Efficient LED Array", U.S. patent application Ser. No. 10/822,191, filed Apr. 9, 2004. These two applications are both hereby incorporated herein by reference.

LED arrays have been successfully fabricated using low temperature co-fired ceramic on metal (LTCC-M) packaging technologies. The LTCC-M structure and materials are described in U.S. Pat. No. 6,455,930, "Integrated Heat Sinking Packages Using Low Temperature Co-fired Ceramic Metal Circuit Board Technology" (issued Sep. 24, 2002) LTCC-M construction is further described in U.S. Pat. No. 5,581,876 (issued Dec. 10, 1996), U.S. Pat. No. 5,725,808 (issued Mar. 30, 1998), U.S. Pat. No. 5,953,203 (issued Sep. 14, 1999) and U.S. Pat. No. 6,518,502 (issued Feb. 11, 2003). U.S. Pat. Nos. 6,455,930, 5,581,876, 5,725,808, 5,953,203, and 6,518,502, all of which are assigned to Lamina Ceramics Inc., are also hereby incorporated herein by reference.

In many applications it is advantageous to control LED arrays with an electronic driver circuit. The driver can either turn the LED on or off, or it can control the output luminosity. Active power semiconductors can be used to provide the driver function. The driver control signal can be simply an on-off command, typically in the form of a low level control or logic signal. Alternatively, the control signal can be an electrical signal that sets the current flow through the LED for the desired luminosity. Where LED current is controlled to set the luminosity of the LED array, it can be further advantageous to include feedback and control circuitry. A photodetector component can be located near the LED array to measure its light output and to provide the needed feedback signal. The problem is the cost and complexity of the additional detector and the mechanical construction required to mount it in or near the array.

It would be highly advantageous to provide LED arrays with an on-board electronic driver and control circuitry including sensors for feedback control. Such circuitry is needed but has been difficult to package on the same substrate as the LEDs. Typically, the LED driver and control circuitry for a particular application are built on a printed wiring board (PCB) external to the LED array. This is problematic for applications that must fit into small spaces. LED arrays using external PCB mounted electronics are also costly. Previous attempts to incorporate driver circuitry into LED array packages have largely been unsuccessful because of the mechanical stresses caused by differences in the thermal coefficients of expansion between semiconductor die and prior art LED packaging methods and materials.

Accordingly, there is a need for an improved LED array devices wherein a less expensive driver, control circuitry, and a photodector sensor can be co-packaged within the array.

SUMMARY OF THE INVENTION

The invention provides a packaged LED array for high temperature operation. In one embodiment, the invention provides a packaged LED array comprising a metal base, the metal base including an underlying thermal connection pad. One or more layers of ceramic overlie the metal base. The array includes a plurality of LED dice thermally coupled to the metal base, each LED die having electrodes. A driver circuit is mounted within the LED array package and electrically connected to the LED die electrodes to provide control of the LED array current. Preferably, at least a portion of the driver circuit is thermally coupled to the metal base.

In a second embodiment, one or more of the LED dice can be connectively switched from a driver circuit to a measurement circuit and used as a photodetector to measure the light output of the LED array. The measured photodetector signal can further be used as a feedback signal to control the LED array light output.

BRIEF DESCRIPTION OF THE FIGURES

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graphs, are not to scale.

DETAILED DESCRIPTION OF THE INVENTION

The detailed description consists of four parts. Section I discloses several embodiments of embedded feedback and control for use in LED array packages. Section II describes the use of one or more of the LED dice of an LED array to provide feedback and control of the array. Section m discusses LED driver circuits suitable for use in the invention. Section IV describes LTCC-M packaging technology as it relates to the current invention.

Section I: Led Array with Integral Feedback and Control

Figure 1:
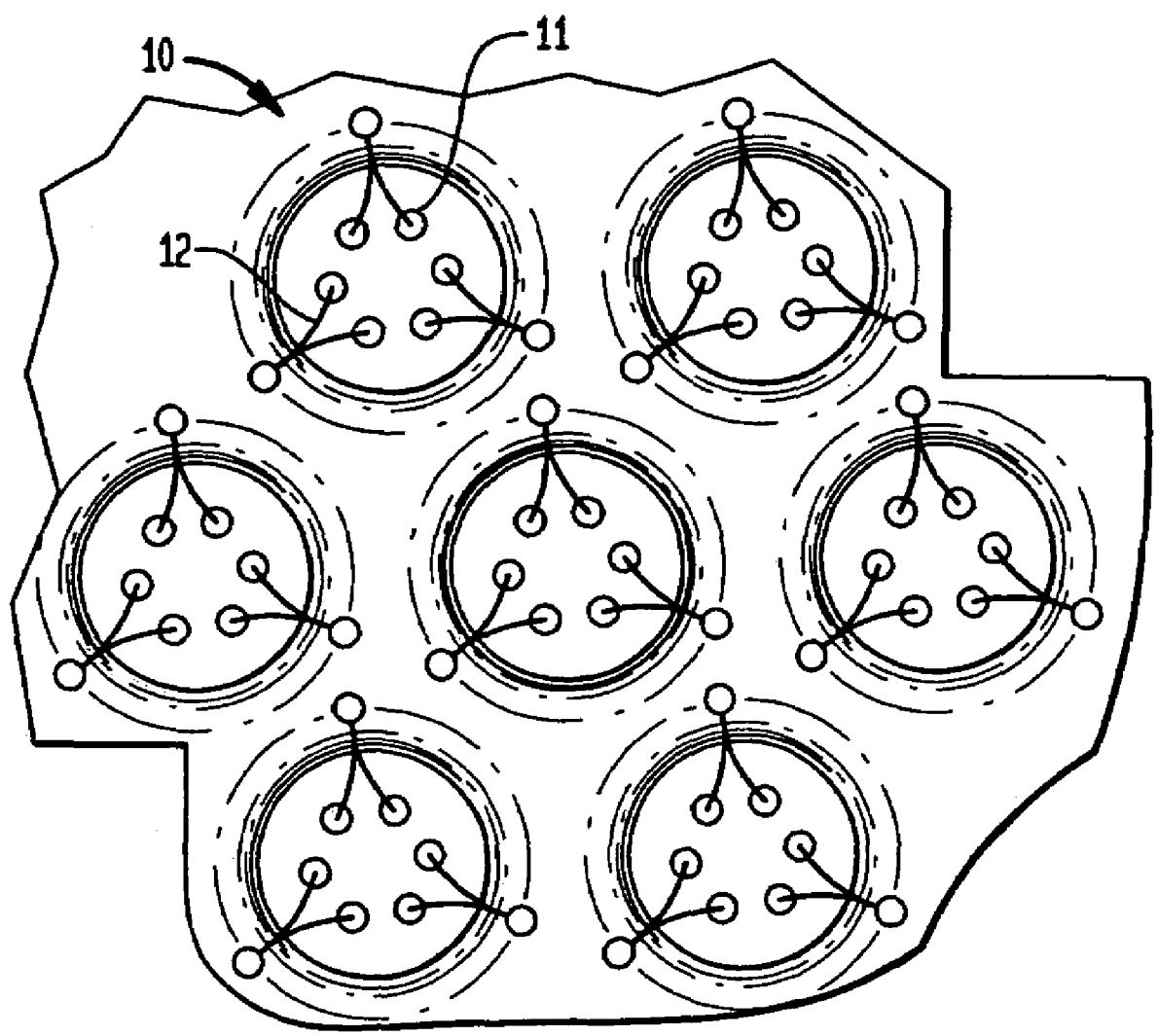
FIG. 1 shows an exemplary LED array.

Referring to the drawings, FIG. 1 shows an exemplary LED array 10. Seven cavities are formed in the ceramic circuit and six LED die 11 are attached to the metal base of each cavity. Electrical connections are made to the die through wire bonds 12 and through a gold electrode on the metal base.

Figure 2:
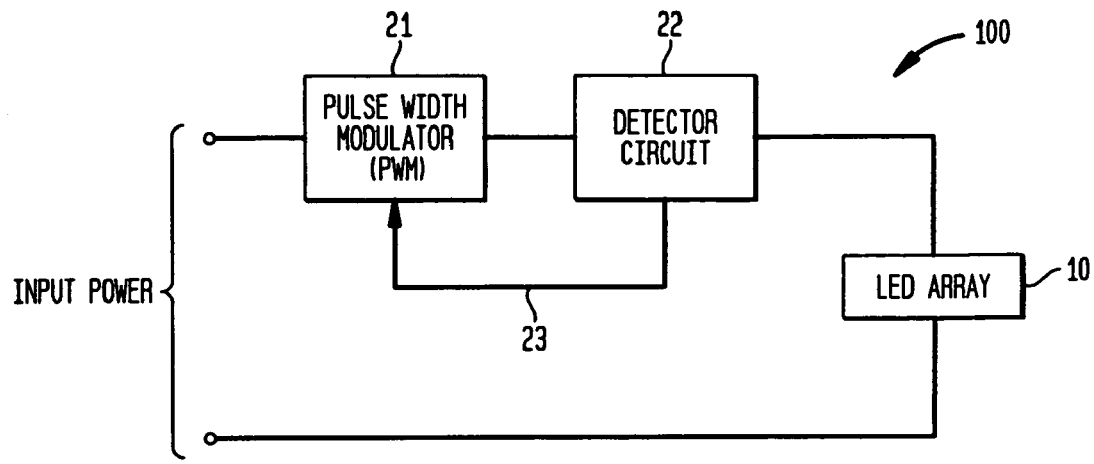
FIG. 2 shows a block diagram of an LED array incorporating an integral driver and feedback and control system.

FIG. 2 shows a block diagram of an exemplary LED array package 100 including LED array 10 incorporating an embedded driver circuit 21 and feedback 23 and detector 22. In one embodiment depicted in FIG. 2, pulse width modulator (PWM) 21 is used as the driver circuit. LED array 10 can be powered by any driver circuit suitable for use in the invention and discussed in more detail in Section III of this application. Driver circuit 21 can also include an error amplifier for closed loop feedback operation based on a measured parameter input. Such measured parameters can include, but are not limited to, array current, voltage, power, light intensity, light flux, light color, magnetic field, or temperature. The desired feedback parameter can be measured by detector 22 and provided via feedback 23 signal to driver circuit 21.

It is understood by those skilled in the art that for the measurement of parameters, such as current, detector 22 can be in series with the array (as shown) or a Hall effect type current sensor. For measurement of other parameters, the sensor can be situated other then is literally shown in the block diagram. For example, it is understood that array voltage would be measured across the LED array terminals and that light can be detected by a light detector in viewing proximity of the illumination generated by the array as shown in the block diagram of FIG. 6.

Figure 3:
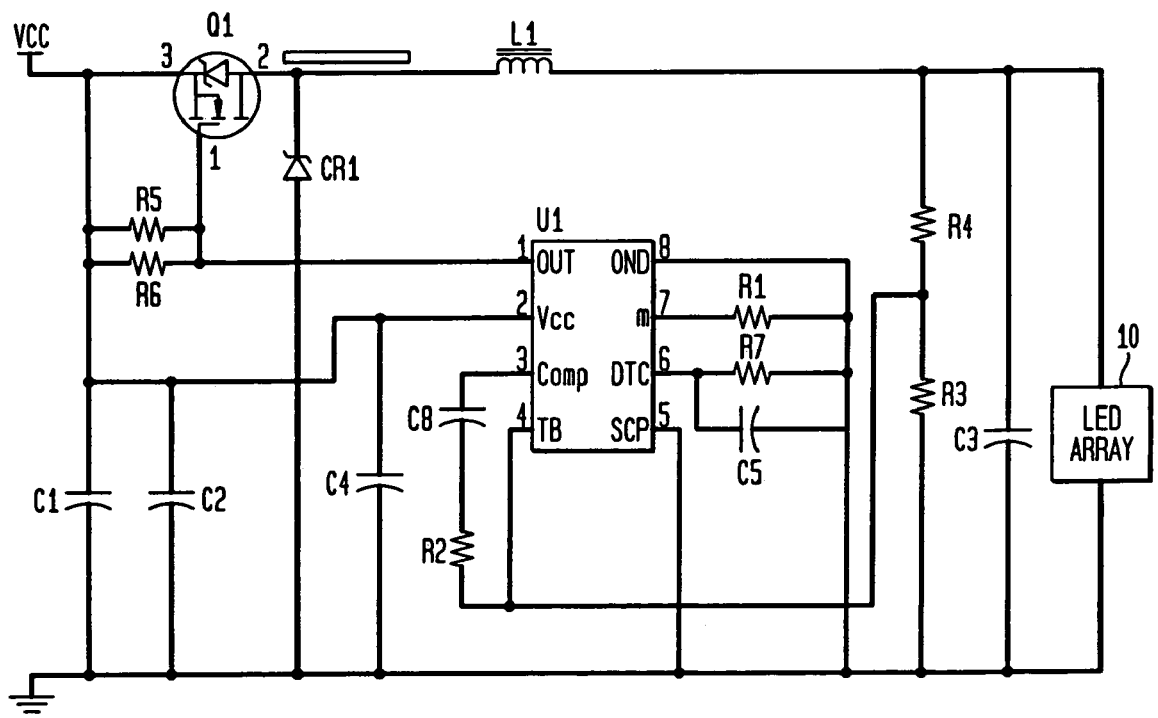
FIG. 3 is a schematic diagram of one embodiment of a pulse width modulated LED array control circuit.

FIG. 3 shows one embodiment of a pulse width modulated driver of a circuit topology suitable for use in embedded LED array 10. This exemplary circuit topology uses semiconductor devices including PWM controller U1, zener diode CR1, and power field effect (FET) transistor Q1. Semiconductors for use in the invention are readily commercially available in die form for direct integration into a package such as an LED array. For example, semiconductors for use in the invention are available from Fairchild Semiconductor, McLean, Va.; Microsemi Corporation, Irvine, Calif.; Motorola, Inc., Schaumburg, Ill.; International Rectifier, El Segundo, Calif.; and National Semiconductor, Santa Clara, Calif.

The temperature coefficient of most of these devices is on the order of 5 ppm per degree centigrade, a poor thermal match for prior art LED array substrates that have thermal coefficients of expansion on the order of 15 to 20 ppm per degree C. With such mismatches, the semiconductors can undergo tremendous mechanical forces due to the heating caused by the LED array. These forces can cause cracking and fractures in the devices that can lead to early LED array failure. Failures range from intermittent or reduced light output to catastrophic failure resulting in no array light output.

In one embodiment of the invention, this problem is solved by mounting such devices on the layers of an LTCC-M packaged array wherein the die are mechanically coupled to glass layers having similar thermal coefficients of expansion. The mechanical forces are thus significantly reduced and more typical semiconductor lifetimes and failure rates can be achieved. LTCC-M technology is discussed in more detail in Section IV of this application.

In another embodiment of the invention, improved thermal management can be achieved by fabricating LED arrays with integral drivers and/or control loops including drivers in LTCC-M technology. Both LED die and drivers and other loop electronics generate significant heat for removal from LED die and other chips. Heat removal is necessary to prevent excessive temperature increases of the array and electronic devices embedded within the array package. By mounting these devices on or in the glass layers and/or metal substrate superior passive cooling can be achieved. In the case of electronics embedded in the glass layers, conducting and non-conducting thermal vias can further enhance waste heat flow by directing it to the metal substrate.

Figure 5:
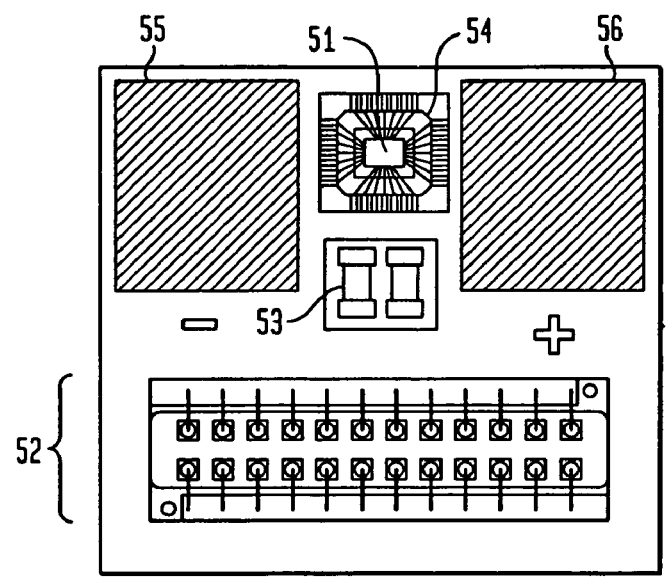
FIG. 5 shows a block diagram of an exemplary LED array with an integral driver circuit.

FIG. 5 shows LED array package 50 including LED array 52 with driver circuit 51 incorporated into LED array package 50. Additional openings in the ceramic circuit and circuit interconnections may be made to accommodate ancillary driver circuitry 53, such as the SMT capacitor shown in FIG. 5. Preferably, driver circuit 51 can be mounted in cavity 54. In this embodiment, driver 51, feedback and control, and reference to set the LED light output can be mounted within cavity 54. Preferably, power is provided to LED array 52 via contact pads 55,56. Contact pads 55,56 can be fabricated from any commercially available material which provides reliable high current power supply connections. Contact pads 55,56 can be constructed from any suitable solderable material, including, but not limited, silver, copper, nickel or tin-lead. In a preferred embodiment, contact pads 55,56 are fabricated with silver palladium.

Figure 6:
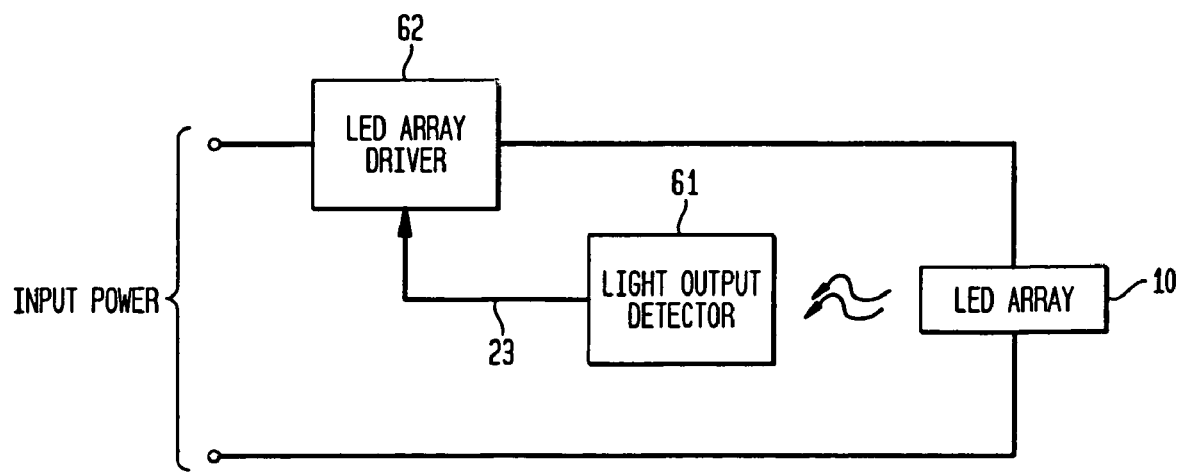
FIG. 6 shows an LED array with integral light detector.

As shown in the block diagram of FIG. 6, photodiode light output detector 61, may be used to detect light emitted from LED array 10. Suitable commercially available photodiode light output detectors for use in the invention include, but are not limited to a Vishay BPW21R, commercially available from Vishay Intertechnology, Inc., Malvern, Pa. If the light output from the array degrades with time, temperature, age, or changing driver parameters, the output of detector 61 will correspondingly fall. The resulting feedback to LED array driver 62 will then increase the output of driver 62, thus maintaining the desired output of LED array 10.

In still another embodiment, additional terminals are provided to allow the user to control the LED array remotely by providing a control reference input signal. Generally, control refers to the simultaneous control of all of the elements of the array, but there can be embodiments where clusters of LED die 11, or individual LED die 11 are uniquely controlled. Typically, the input control reference signal will be an analog control signal, but it can also be a digital control signal wherein the LED array further comprises digital circuitry suitable for receiving a digital control signal. A digital signal can control the LED array by directly controlling the driver circuitry, providing a reference to a digitally controlled internal feedback and control loop, or by conversion on the LED array assembly to an analog control signal as by a digital to analog converter. Alternatively, pseudo-digital control can be accomplished by a frequency to analog signal converter built into the LED array.

Section II: Using One or More LEDs of the LED Array as a Detector

In another embodiment, one or more of the LED dice of an LED array can be switched from driver circuit to light measurement circuit and used as a photodetector to measure the light output of a LED array. According to one embodiment depicted in FIG. 7, output light from LED array 10 is detected by using one or more of the LED dice in LED array 10 as a photodetector (See FIG. 7). In operation, one or more LED dice of LED array 10 are alternately electrically connected to driver circuit 62 or to light measurement circuit 80 and feedback 64 by switch 71. LED die 11 function as a light source when connected to driver circuit 62 and as photodetector 63 when periodically and momentarily disconnected from driver circuit 62 by operation of switch 71.

Figure 7:
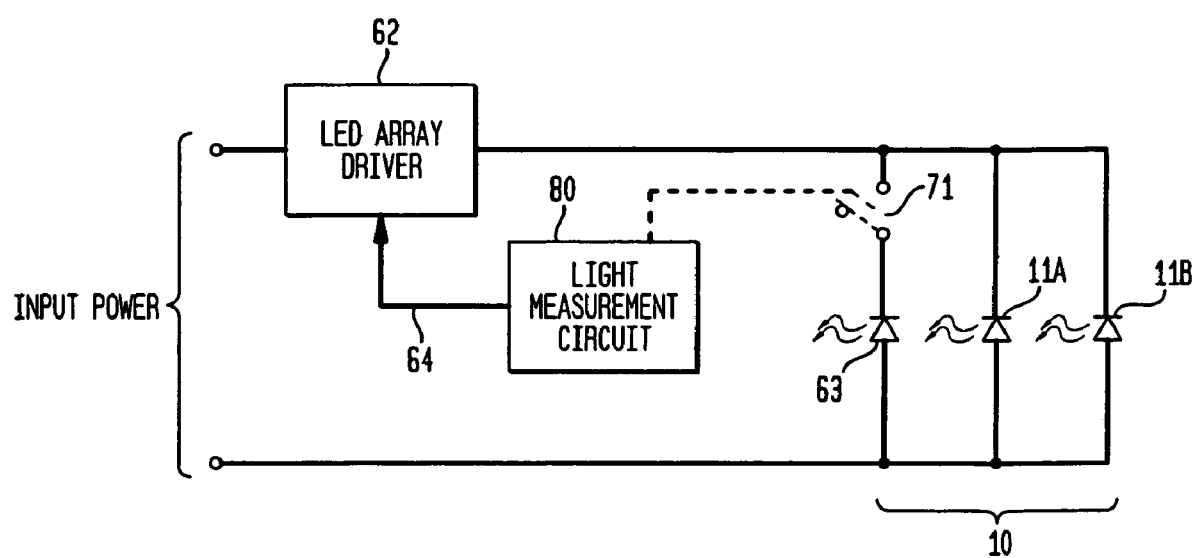
FIG. 7 shows an exemplary LED array with integral light detector where one LED die of the array alternatively serves as a light detector and source of light.

According to one embodiment, FIG. 7 shows LED array 10 with switch 71 in a position such that the LED die on the far left of LED array 10 operates as a LED photodetector 63. Upon disconnection from driver circuit 62, photodetector 61 detects the light emitted from adjacent LEDs 11A and 11B. Using this technique, the array light output can be periodically sampled by measurement circuit 80 and fed back to driver circuit 62 via feedback 64.

Driver circuit 62 can then make the appropriate adjustments in the control of LED array 10 according to the measurement provided by measurement circuit 80. Upon completion of the measurement of the light output of LED array 10, measurement circuit 80 operates switch 71 (operative control shown by dashed line in FIG. 7) to re-connect photodetector 61 to driver circuit 62.

The one or more LED dice connected to switch 71 used for light detection can be switched from the detection mode and back to the light emission mode rapidly, preferably in less than 10 ms. At this relatively fast switching rate, the photo-detection sampling mode will not be perceived by the observer of the light. Using one or more LED dice in LED array 10 for photodetection reduces the cost and complexity of the device as compared to using an independent photodetector.

Applications using one or more LED dice of LED array 10 as a photodetector include, but are not limited to, the regulation of output light and LED failure detection. In the light regulation function, LED die operating as a photodetector can serve as linear feedback elements to the feedback and control circuits, as described in detail in Section I. For failure detection, photodetector 63 can detect a threshold change in output level indicating low light emission from one or more emitters in the LED array. This mode of detection is advantageous over electrical detection schemes. For example, one drawback of electrical detection schemes is that they can only infer low light output by detecting changes in a parameter such as LED current.

EXAMPLE

The following is an example of a device comprising co-packaging light emitting diode arrays wherein one or more of the LEDs are used as a photodetector to detect the light output of the LED array. The device is constructed beginning with a suitable metal laminate base. Preferably, a 13% copper, 74% molybdenum, 13% copper (CMC) metal laminate is used. More preferably, the CMC metal laminate produced by H. C. Starck Corporation, Newton, Mass., can be used in accordance with the invention.

Thick film gold bonding pads, corresponding to the location of each die, can be fired on the metal base to include LED die and any die used for control and feedback purposes. The pads can be connected electrically and thermally to the CMC base. Layers of CMC-compatible ceramic tape can be used to form the die cavities, to make the electrical connections, and to form the array housing. The ceramic tape is composed of glasses and resins which are readily commercially available, including, but not limited to those supplied by Ferro Corporation, Cleveland, Ohio, and others. The tape materials can be ground, mixed, and cast into flat sheets. The sheets can then be processed using common "green" tape processing including punching, printing, collating, and laminating. These techniques are well-known by those having ordinary skill in the art. The CMC base is attached during lamination and joined to the tape layers during firing at ~900° C. Multiple arrays can be processed on a single wafer, which is then singulated by dicing after firing.

After the base module is provided with the ceramic layers, individual die can be connected to the gold pads in the bottom of each cavity by soldering, preferably using a 80% Au/20% Sn solder. Alternatively, the individual die can be connected to the gold pads using an electrically conductive epoxy, including, but not limited to Ablebond 84LMI, commercially available from Emerson & Cuming, Canton, Mass.

The gold pads can be connected to the metal base. Conductive vias are used to connect an electrical terminal on the top ceramic layer to the metal base. The anode or cathode can be commonly connected to the back side of die which is in turn connected to the gold bonding pad. The opposite side of the die can be electrically connected to the array using a wire bond. The bond can be connected from the die to a bonding pad on one of the ceramic layers. Thick film, conductive traces can also be deposited onto the surface of the ceramic layer containing the bonding pads. The traces can be connected to an electrical terminal on the top ceramic layer through electrically conductive vias. A variety of die connections are possible including series, parallel, and combined series-parallel.

According to the example, the package is produced having seven cavities. Each cavity contains three red LEDs, three green LEDs, and one blue LED. Upon application of power to a single color of the LED array, the light output of the other LEDS can be detected by measuring the voltage produced across one of the other colored LEDs.

Preferably, the light output from a particular color LED is detected using another LED which has the same or greater wavelength emission. For example, it is preferable to use a red LED (625 nm wavelength) over a blue LED (470 nm wavelength) to detect the output of a green LED (505 nm wavelength). Additionally, it is contemplated that one or more of the red LEDs can be used to detect the output of the remaining red LEDs in the array. The light sensitivity of the LED is another factor to consider in determining the appropriate LED to use as the detector.

Figure 11:
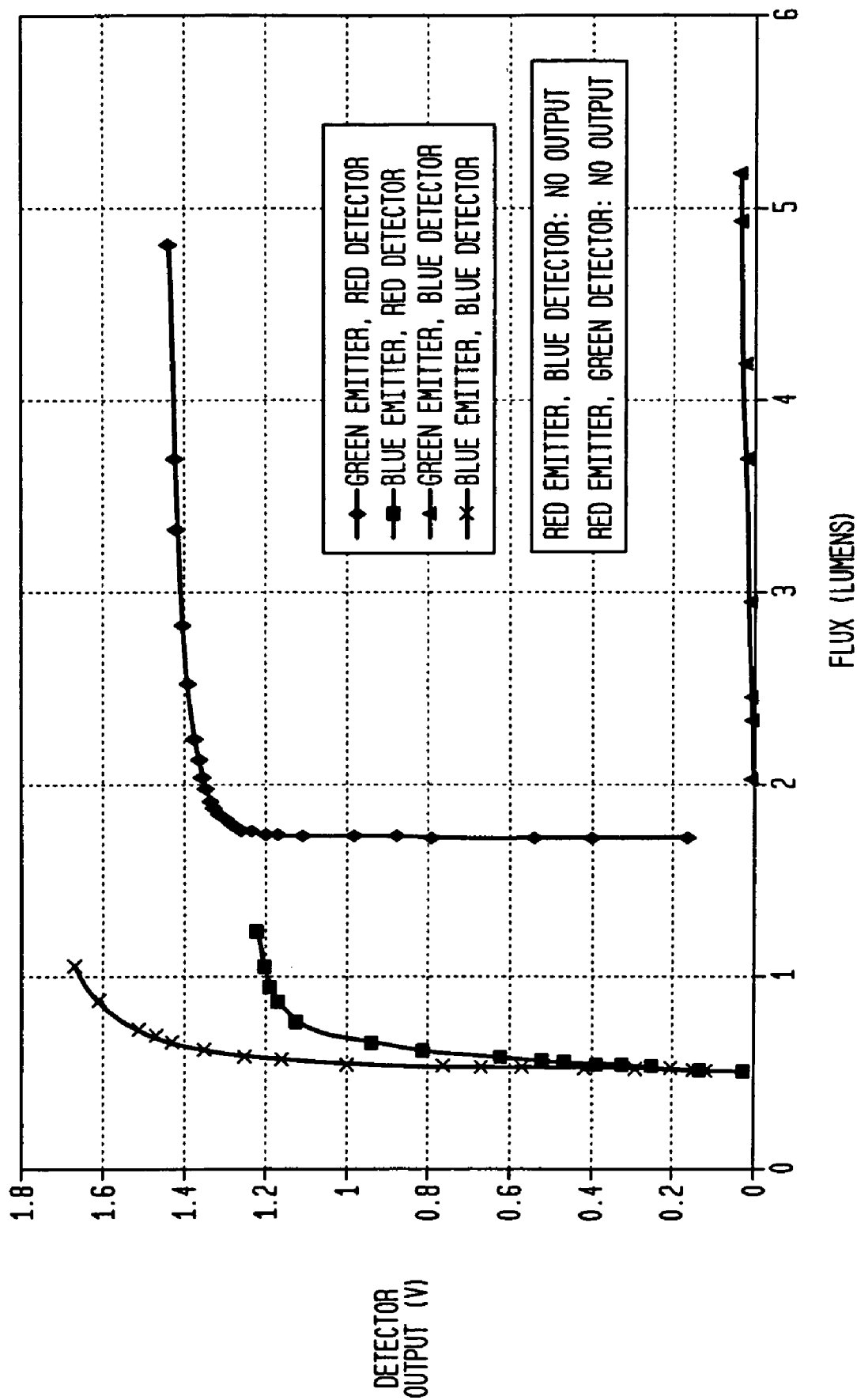
FIG. 11 is a graph depicting detected flux using an LED die as a light detector.

More preferably, the different detector LEDs should be used in their most efficient detection range. The detection range should be selected such that the detector operates just below the knee of the curve shown in FIG. 11.

Additionally, voltage dropping and current limiting resistors, inductors, and capacitors can be added as components buried in between the ceramic layers, or as discrete components mounted on the top surface of the package. Additional control, ESD protection, and voltage regulation semiconductors may be added in die or packaged form. Finally, an index matching epoxy, such as Hysol® 1600, available from Henkel Loctite® Corporation, 1001 Trout Brook Crossing, Rocky Hill, Conn., can be added to each die cavity to protect the device.

Section III: Led Drivers for Use in the Invention

Several LED array light properties may be corrected using automatic control. For example, light output (Luminous or Radiated flux) may be controlled by including a constant current driver in the LED array. The light output (Φ) of an LED over its linear operating range is proportional to the forward DC current and given by the following equation:

$$\Phi = \eta IV$$

Figure 8:
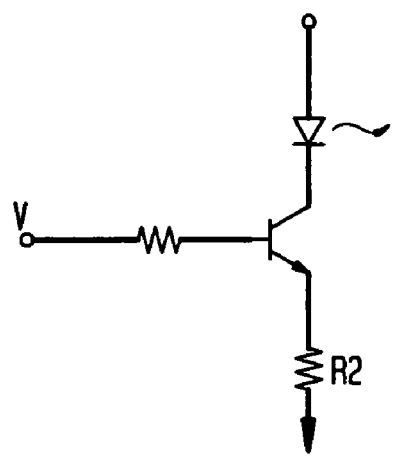
FIG. 8 shows a schematic diagram of a transistor constant current driver circuit.
Figure 9:
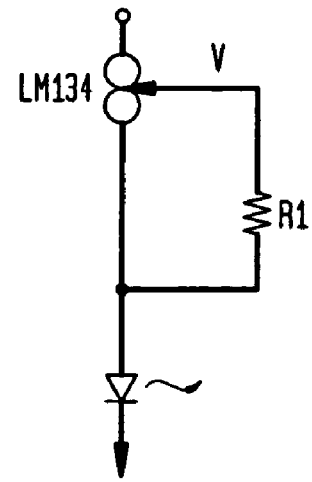
FIG. 9 shows a schematic diagram of an exemplary LM134 driver integrated circuit.
Figure 10:
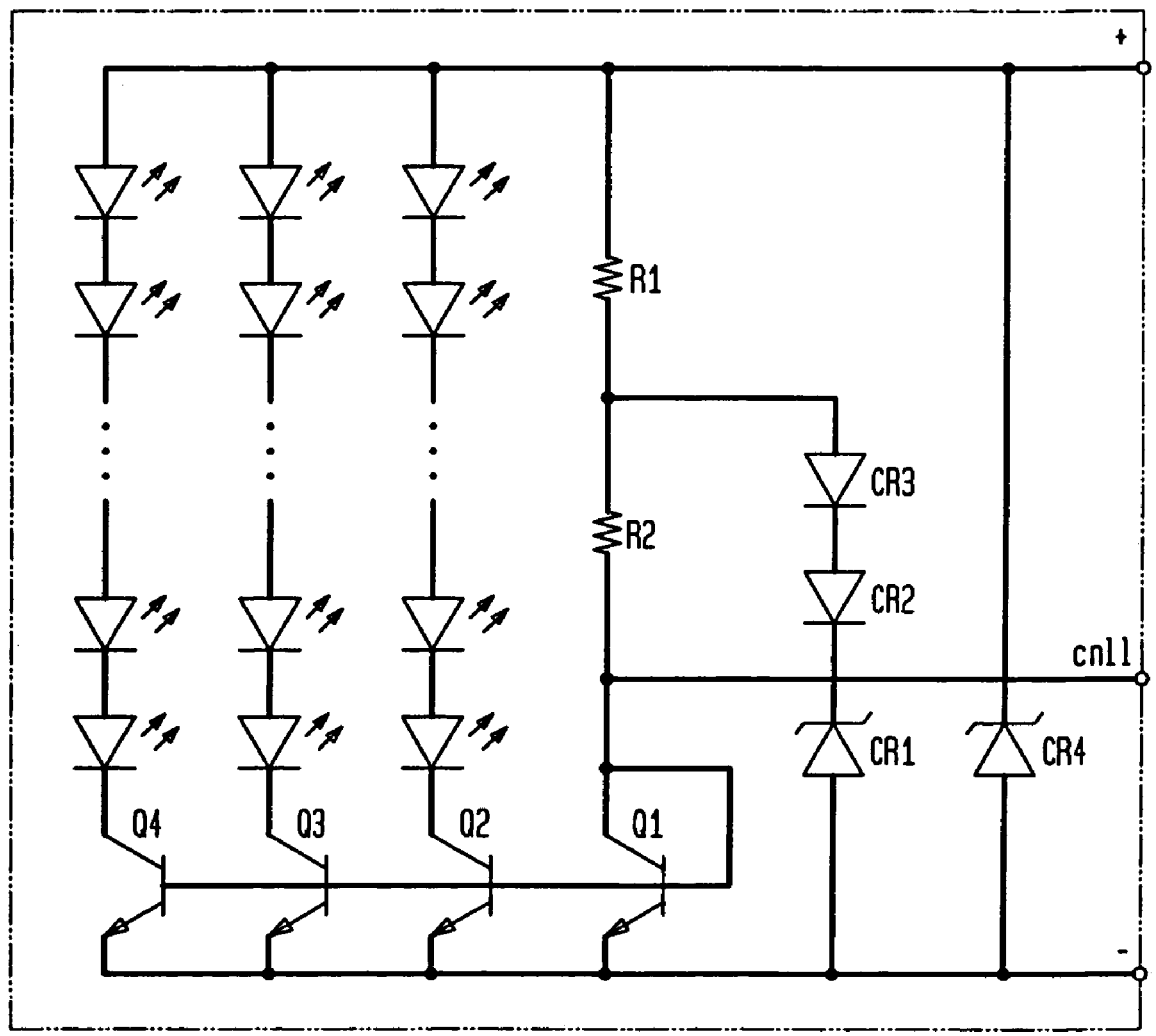
FIG. 10 shows a schematic diagram of a multiple string constant current driver circuit.

Where:
η=the diode external quantum efficiency
I=forward diode currency
V=the diode forward voltage FIG. 8 shows one example of a LED driver suitable for use in the invention. Using a silicon bi-polar transistor as shown in FIG. 8, the diode current may be held constant. FIG. 9 shows another constant current driver suitable for use in the invention. This driver includes a current mirror for driving multiple diode strings with identical forward current. Another option for constant current operation is to use special integrated circuits designed specifically for this purpose, such as the LM134 3-Terminal Adjustable Current Source, available from National Semiconductor Corporation, Santa Clara, Calif., shown in FIG. 9. FIG. 10 shows an exemplary multiple string constant current driver circuit suitable for use in the invention Advantageously, the circuits shown in FIGS. 8, 9 and 10 are simple and inexpensive drivers for use in the invention. Yet another driver circuit for use in the invention is a variable pulse width control (VPWC) circuits, shown in FIGS. 2 and 3.

Referring to FIG. 2, PWM circuit 21 can vary the current or voltage pulse width based on a feedback signal from parameter detector 22. Detector 22 can be used to monitor power consumption, current, voltage, temperature, luminous or radiant flux, or other desired parameter. The PWM output can work to produce the desired feedback regardless of changes at the load (LED array 10) or input variations.

The circuit depicted in FIG. 3 controls the power delivered LED array 10 for a wide range of input voltage. This circuit is useful in automotive applications where the input voltage may change from a low level during battery operation, to a high level when the battery is charging. This circuit is designed to maintain constant power to an LED(s) connected across C3 for an input voltage (VCC) variation of 9 to 20 volts. Constant power (constant light output) is maintained by varying the width of the current pulse to the LED(s). As the input voltage increases the pulse width narrows. The pulse width variation serves to minimize the power dissipation. Circuits with efficiencies of greater than 90% are common.

According to another embodiment, the circuits depicted in FIGS. 2, 3, 6, 7, 8, 9, and 10 can be built into a typical LTCC-M array, described in detail in Section IV and shown in FIG. 1.

Section IV: LTCC-M Packaging

LTCC-M packaging is particularly suitable for LED arrays because of the high heat generated by densely packed arrays of LED die. This section highlights some of the important aspects of LTCC-M packaging as applicable to fabricating LED arrays with reflective barriers.

Multilayer ceramic circuit boards are made from layers of green ceramic tapes. A green tape is made from particular glass compositions and optional ceramic powders, which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750-950° C. The compositions of the glasses determines the coefficient of thermal expansion, the dielectric constant and the compatibility of the multilayer ceramic circuit boards to various electronic components. Exemplary crystallizing glasses with inorganic fillers that sinter in the temperature range 700 to 1000° C. are Magnesium Alumino-Silicate, Calcium Boro-Silicate, Lead Boro-Silicate, and Calcium Alumino-Boricate.

More recently, metal support substrates (metal boards) have been used to support the green tapes. The metal boards lend strength to the glass layers. Since the green tape layers can be mounted on both sides of a metal board and can be adhered to a metal board with suitable bonding glasses, the metal boards permit increased complexity and density of circuits and devices. In addition, passive and active components, such as resistors, inductors, and capacitors can be incorporated into the circuit boards for additional functionality. Where optical components are installed, such as LEDs, the walls of the ceramic layers can be shaped and/or coated to enhance the reflective optical properties of the package. Alternatively, reflective barriers can be used to further improve both the illumination and thermal efficiency of the LED array package.

This system, known as low temperature cofired ceramic on metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure must be matched to the thermal coefficient of expansion of the metal support board. Glass ceramic compositions are known that match the thermal expansion properties of various metal or metal matrix composites. The metal support boards used for LTCC-M technology exhibit a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including percentages of molybdenum of from about 10% to about 25% by weight of copper) or copper and tungsten (including percentages of tungsten of from about 10% to about 25% by weight of copper), made using powder metallurgical techniques. AlSiC is another material that can be used for direct attachment, as can aluminum or copper graphite composites. An example of a suitable support boards for use in the invention is Copper clad Kovar®, which includes a metal alloy of iron, nickel, cobalt and manganese. Copper clad Kovar® is a trademarked product of Carpenter Technology, Reading, Pa.

Another application requiring efficient cooling involves thermal management of flip chip packaging. Densely packed microcircuitry, and devices such as decoder/drivers, amplifiers, oscillators and the like, which generate large amounts of heat, can also use LTCC-M techniques advantageously. Metallization on the top layers of an integrated circuit bring input/output lines to the edge of the chip so as to be able to wire bond to the package or module that contains the chip. Thus the length of the wirebond wire becomes an issue; too long a wire leads to parasitics. The cost of very high integration chips may be determined by the arrangement of the bond pads, rather than by the area of silicon needed to create the circuitry. Flip chip packaging overcomes at least some of these problems by using solder bumps rather than wirebond pads to make connections. These solder bumps are smaller than wire bond pads and, when the chip is turned upside down, or flipped, solder reflow can be used to attach the chip to the package. Since the solder bumps are small, the chip can contain input/output connections within its interior if multilayer packaging is used. Thus the number of die in it, rather than the number and size of bond pads will determine the chip size.

The ceramic layers of the LTCC-M structure must be matched to the thermal coefficient of expansion of the metal support board. Glass ceramic compositions are known that match the thermal expansion properties of various metal or metal matrix composites. The LTCC-M structure and materials are described in U.S. Pat. No. 6,455,930, "Integrated Heat Sinking Packages Using Low Temperature Co-fired Ceramic Metal Circuit Board Technology", issued Sep. 24, 2002 to Ponnuswamy, et al. and assigned to Lamina Ceramics. U.S. Pat. No. 6,455,930 is hereby incorporated herein by reference. The LTCC-M structure is further described in U.S. Pat. Nos. 5,581,876, 5,725,808, 5,953,203, and 6,518,502, all of which are assigned to Lamina Ceramics and also hereby incorporated herein by reference.

The metal support boards used for LTCC-M technology do have a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including from 10-25% by weight of copper) or copper and tungsten (including 10-25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

Thermal management of flip-chip packaging is yet another application requiring efficient cooling. Densely packed microcircuitry, and devices such as decoder/drivers, amplifiers, oscillators and the like which generate large amounts of heat, can also use LTCC-M techniques advantageously. Metallization on the top layers of an integrated circuit bring input/output lines to the edge of the chip so as to be able to wire bond to the package or module that contains the chip. Thus the length of the wirebond wire becomes an issue; too long a wire leads to parasitics. The cost of very high integration chips may be determined by the arrangement of the bond pads, rather than by the area of silicon needed to create the circuitry. Flip chip packaging overcomes at least some of these problems by using solder bumps rather than wirebond pads to make connections. These solder bumps are smaller than wire bond pads and, when the chip is turned upside down, or flipped, solder reflow can be used to attach the chip to the package. Since the solder bumps are small, the chip can contain input/output connections within its interior if multilayer packaging is used. Thus the number of die in it, rather than the number and size of bond pads will determine the chip size.

However, increased density and integration of functions on a single chip leads to higher temperatures on the chip, which may prevent full utilization of optimal circuit density. The only heat sinks are the small solder bumps that connect the chip to the package. If this is insufficient, small active or passive heat sinks must be added on top of the flip chip. Such additional heat sinks increase assembly costs, increase the number of parts required, and increase the package costs. Particularly if the heat sinks have a small thermal mass, they have limited effectiveness as well.

In the simplest form of the present invention, LTCC-M technology is used to provide an integrated package for a semiconductor component and accompanying circuitry, wherein the conductive metal support board provides a heat sink for the component. A bare semiconductor die, for example, can be mounted directly onto a metal base of the LTCC-M system having high thermal conductivity to cool the semiconductor component. In such case, the electrical signals to operate the component must be connected to the component from the ceramic.

Indirect attachment to the metal support board can also be used. In this package, all of the required components are thermally coupled to a metal support board, that can also incorporate embedded passive components such as conductors and resistors into the multilayer ceramic portion, to connect the various components, i.e., semiconductor components, circuits, heat sink and the like, in an integrated package. In the case of LED arrays, where electrical circuit considerations would dictate an insulating material be used, thermal conduction can be problematic. Here the reflective barriers further serve as thermal spreading devices to help transfer heat received by conduction and radiation through the insulating layer to the metal base.

It is also possible to mount an LTCC-M circuit to a printed wiring board or other patterned conductor mounting device by its metal substrate surface. Patterns may be cut into the metal substrate with insulators defining isolated electrical terminals in the metal substrate surface. These terminals are explained in detail in U.S. Pat. No. 6,518,502 (issued Feb. 11, 2003) to Hammond, et al. and assigned to Lamina Ceramics, Inc. U.S. Pat. No. 6,518,502 is hereby incorporated herein by reference.

For a more complex structure having improved heat sinking, the integrated package of the invention combines a first and a second LTCC-M substrate. The first substrate can have mounted thereon a semiconductor device, and a multilayer ceramic circuit board with embedded circuitry for operating the component; the second substrate has a heat sink or conductive heat spreader mounted thereon. Thermoelectric (TEC) plates (Peltier devices) and temperature control circuitry are mounted between the first and second substrates to provide improved temperature control of semiconductor devices. A hermetic enclosure can be adhered to the metal support board.

The use of LTCC-M technology can also utilize the advantages of flip chip packaging together with integrated heat sinking. The packages of the invention can be made smaller, cheaper and more efficient than existing present-day packaging. The metal substrate serves as a heat spreader or heat sink. The flip chip can be mounted directly on the metal substrate, which is an integral part of the package, eliminating the need for additional heat sinking. A flexible circuit can be mounted over the bumps on the flip chip. The use of multilayer ceramic layers can also accomplish a fan-out and routing of traces to the periphery of the package, further improving heat sinking. High power integrated circuits and devices that have high thermal management needs can be used with this new LTCC-M technology.

Figure 4:
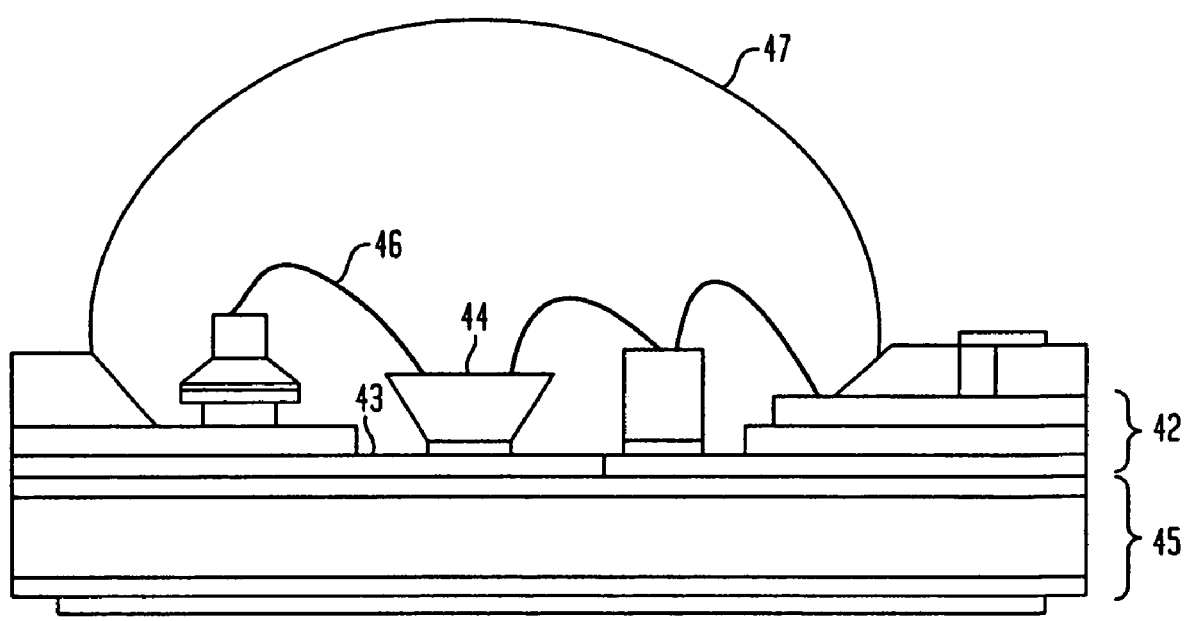
FIG. 4 shows a cross-section of an exemplary LTCC-M LED array.

FIG. 4 shows a cross-section of an exemplary LED array package using LTCC-M construction. The LTCC-M structure consists of a thermally conductive metal base connected to multilayer ceramic circuit board 42. Openings 43 in ceramic circuit board 42 are made to accommodate semiconductor die 44 and other components. The components are attached directly to metal base 45. Metal base 45 can be constructed from any suitable material, such as copper tungsten; kovar; or metal laminates, such as copper molybdenum, having various thickness ratios. Preferably, metal base 45 can be fabricated from copper clad molybdenum. Attachment to metal base 45 keeps semiconductor die 44 cool and allows for efficient and reliable operation.

Typically, connections to semiconductor die 44 are made using wire bonds 46 or with flip-chip attachment (not shown). Preferably, wire bonds 46 are protected using polymer encapsulate 47.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A LED array package for high temperature operation comprising:
   a metal base;
   a thermal connection pad underlying the metal base; one or more ceramic layers overlying the metal base;
   a plurality of LED dice each having a pair of electrodes, the LED dice thermally coupled to the thermal connection pad through the metal base;
   a driver circuit mounted within the package and thermally coupled to the metal base, the driver circuit having output which controls a current supplied to the LED dice;
   a measurement circuit to measure a light output of the LED array; an electronic switch to switch a connection of one or more LED dice from the driver circuit to the measurement circuit, wherein when the one or more LED dice are disconnected from the driver circuit and connected to the measurement circuit, the one or more disconnected LED dice act as a LED photodetector thereby detecting a light output of the LED array, generating a measured signal and providing the measured signal to the measurement circuit; and
   a control circuit to accept the measured signal from the measurement circuit and control the LED array light output by adjusting the driver circuit output.

2. The LED array package of claim 1 wherein the measured signal is a voltage or current of the LED photodetector.

3. The LED array package of claim 1 wherein the electronic switch connects the one or more LED dice to the measurement circuit for a period of $\leq 10$ ms.

4. The LED array package of claim 1 wherein the package is a LTCC-M package.

5. The LED array package of claim 1 wherein the one or more ceramic layers further comprise electrically conductive traces.

6. The LED array package of claim 1 wherein the one or more ceramic layers comprise a printed circuit layer.

7. A method of providing optical feedback within an LED array comprising the steps of:
   providing an LED array including a plurality of LED dice, a driver circuit and a detector circuit;
   providing a switch to switch one or more of the LED dice from the driver circuit to the detector circuit;
   switching the one or more of the LED dice between the driver circuit and the detector circuit;
   measuring a light output of the LED array using the switched one or more of the LED dice to provide a measurement signal; and
   feeding the measurement signal back to the driver circuit to control the LED array light output.

8. The method of claim 7 wherein switching comprises the step of switching between the driver circuit and the detector circuit at a rate sufficiently fast to appear to a human to be steady illumination.

9. The method of claim 7 wherein the switching comprises the step of switching between the driver circuit and the detector circuit at a periodic rate.

* * * * *